US012712562B2

(12) United States Patent
Chen et al.

(10) Patent No.: US 12,712,562 B2
(45) Date of Patent: Aug. 18, 2026

(54) RECEIVER CIRCUIT SCHEME CAPABLE OF AVOIDING CLOCK HARMONIC INTERFERENCES AND REDUCING PHASE ERRORS TO MAINTAIN DEMODULATOR CAPABILITY

(71) Applicant: PixArt Imaging Inc., Hsin-Chu City (TW)

(72) Inventors: Chia-Pei Chen, Hsin-Chu City (TW); Han-Hau Wu, Hsin-Chu City (TW); Chun-Yuan Chiu, Hsin-Chu City (TW); Chia-Chang Chen, Hsin-Chu City (TW)

(73) Assignee: PixArt Imaging Inc., Hsin-Chu City (TW)

( * ) Notice: Subject to any disclaimer, the term of this patent is extended or adjusted under 35 U.S.C. 154(b) by 16 days.

(21) Appl. No.: 19/053,385

(22) Filed: Feb. 13, 2025

(65) Prior Publication Data

US 2026/0238219 A1 Aug. 13, 2026

(51) Int. Cl.
*H03M 1/12* (2006.01)
*H04B 1/00* (2006.01)
*H04B 1/40* (2015.01)

(52) U.S. Cl.
CPC ........ *H03M 1/1245* (2013.01); *H04B 1/0028* (2013.01); *H04B 1/40* (2013.01)

(58) Field of Classification Search
CPC .......... H04B 1/0028; H04B 1/06; H04B 1/16; H04B 1/40; H04B 1/403; H03M 1/1245; H03M 1/126; H03M 1/1265; H04L 25/00; H04L 25/02
See application file for complete search history.

(56) References Cited

U.S. PATENT DOCUMENTS

| | | | | |
|---|---|---|---|---|
| 7,373,119 B2 * | 5/2008 | Petersson | H03M 1/1255 | 455/150.1 |
| 8,064,560 B2 * | 11/2011 | Hunter | H03M 1/126 | 375/326 |
| 8,077,818 B2 * | 12/2011 | Abe | H04B 1/0007 | 455/208 |
| 2014/0328233 A1 * | 11/2014 | Shih | H04W 52/029 | 370/311 |

* cited by examiner

*Primary Examiner* — Betsy Deppe
(74) *Attorney, Agent, or Firm* — Winston Hsu

(57) ABSTRACT

A method of receiver circuit includes: providing a mixer to mix a radio frequency signal with a local oscillator signal to generate an intermediate frequency signal; generating a baseband signal according to the intermediate frequency signal; using a receiver analog-to-digital converter (ADC) to sample information of the baseband signal to convert the baseband signal into a digital reception signal according to a working sample rate; and dynamically switching the working sample rate between a first sample rate and a second sample rate, to make a harmonic of first sample rate be not in a specific channel frequency of the radio frequency signal and a harmonic of second sample rate be not in the specific channel frequency of the radio frequency signal; the first sample rate and second sample rate are adjacent to the target sample rate.

14 Claims, 4 Drawing Sheets

| Channel | LO freq (MHz) | ratio to fref | div1 | fadc1 (MHz) | error1 (ppm) | div2 | fadc2 (MHz) | error2 (ppm) | div1 to div2 ratio | phase error @110 cycles (deg) | SNR loss @110 cycles (dB) |
|---|---|---|---|---|---|---|---|---|---|---|---|
| 2412MHz | 2411 | 200.917 | 201 | 11.995 | -415 | 200 | 12.055 | 4583 | 11.000 | 1.369 | 0.058 |
| 2424MHz | 2423 | 201.917 | 202 | 11.995 | -413 | 201 | 12.055 | 4561 | 11.000 | 1.362 | 0.058 |
| 2436MHz | 2435 | 202.917 | 203 | 11.995 | -411 | 202 | 12.054 | 4538 | 11.000 | 1.355 | 0.058 |
| 2448MHz | 2447 | 203.917 | 204 | 11.995 | -408 | 203 | 12.054 | 4516 | 11.000 | 1.349 | 0.057 |
| 2460MHz | 2459 | 204.917 | 205 | 11.995 | -407 | 204 | 12.054 | 4493 | 11.000 | 1.342 | 0.057 |
| 2472MHz | 2471 | 205.917 | 206 | 11.995 | -405 | 205 | 12.054 | 4472 | 11.000 | 1.335 | 0.057 |

FIG. 4

RECEIVER CIRCUIT SCHEME CAPABLE OF AVOIDING CLOCK HARMONIC INTERFERENCES AND REDUCING PHASE ERRORS TO MAINTAIN DEMODULATOR CAPABILITY

BACKGROUND OF THE INVENTION

1. Field of the Invention

The invention relates to a receiver circuit's mechanism, and more particular to a receiver circuit and a corresponding method.

2. Description of the Prior Art

Generally speaking, the sensitivity of a conventional receiver circuit may be degraded due to the strong interfering signals (or noise). For example, the ADC (analog-to-digital converter) clock harmonics of the conventional receiver circuit may inevitably interfere with radio-frequency (RF) signals and impacts on the conventional receiver circuit's performance. The digital clocks generate the clock harmonics at multiples of the fundamental frequency. When these harmonic frequencies overlap with the RF reception band, they can create interference that degrades receiver sensitivity.

SUMMARY OF THE INVENTION

Therefore one of the objectives of the invention is to provide a receiver circuit and corresponding method, to solve the above-mentioned problems.

According to the embodiments of the invention, a receiver circuit is disclosed. The receiver circuit comprises a mixer, an intermediate frequency processing, and a receiver analog-to-digital converter (ADC). The mixer is used for mixing a radio frequency signal with a local oscillator signal to generate an intermediate frequency signal. The intermediate frequency processing circuit, coupled to the mixer, is used for generating a baseband signal according to the intermediate frequency signal. The receiver ADC, coupled to the intermediate frequency processing circuit, is used for sampling information of the baseband signal to convert the baseband signal into a digital reception signal according to a working sample rate. The working sample rate is dynamically switched between a first sample rate and a second sample rate which are adjacent to a target sample rate, to make a harmonic of the first sample rate be not in a specific channel frequency of the radio frequency signal and a harmonic of the second sample rate be not in the specific channel frequency of the radio frequency signal. The first sample rate is lower than the target sample rate while the second sample rate is higher than the target sample rate.

According to the embodiments, a method of a receiver circuit is disclosed. The method comprises: providing a mixer to mix a radio frequency signal with a local oscillator signal to generate an intermediate frequency signal; providing an intermediate frequency processing circuit to generate a baseband signal according to the intermediate frequency signal; using a receiver analog-to-digital converter (ADC) to sample information of the baseband signal to convert the baseband signal into a digital reception signal according to a working sample rate; and, dynamically switching the working sample rate between a first sample rate and a second sample rate which are adjacent to a target sample rate, to make a harmonic of the first sample rate be not in a specific channel frequency of the radio frequency signal and a harmonic of the second sample rate be not in the specific channel frequency of the radio frequency signal. The first sample rate is lower than the target sample rate while the second sample rate is higher than the target sample rate.

According to the embodiments, the receiver circuit and method can improve the receiver desensitization caused by the receiver ADC and avoid performance degradation of the receiver circuit's demodulator. The receiver desensitization is caused by clock harmonics of the sample clock/rate used by the receiver ADC, the clock harmonics may be coupled to some specific frequency channels and become noise interferences for the radio frequency signals received within the specific frequency channels. In addition, this receiver circuit and method can improve the capability and performance of the demodulator by using dynamic frequency switching (or called as dynamic dual divisors (division factors)) to reduce the accumulated phase error, e.g. the phase error accumulated during a long packet time of the Bluetooth communication. The accumulated phase error can automatically return to zero within a short time period according to the invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram of an example of the table of corresponding LO frequencies, variable division factors, and generated phase errors in different channel frequencies used by the receiver circuit according to an embodiment of the invention.

DETAILED DESCRIPTION

The invention aims at providing a technical solution of a receiver circuit capable of accurately separating the clock harmonics from the used channel frequencies of receiver circuit to mitigate the internal noise interference based on a configured minor frequency deviation as well as effectively reducing the accumulated phase errors.

Figure 1:
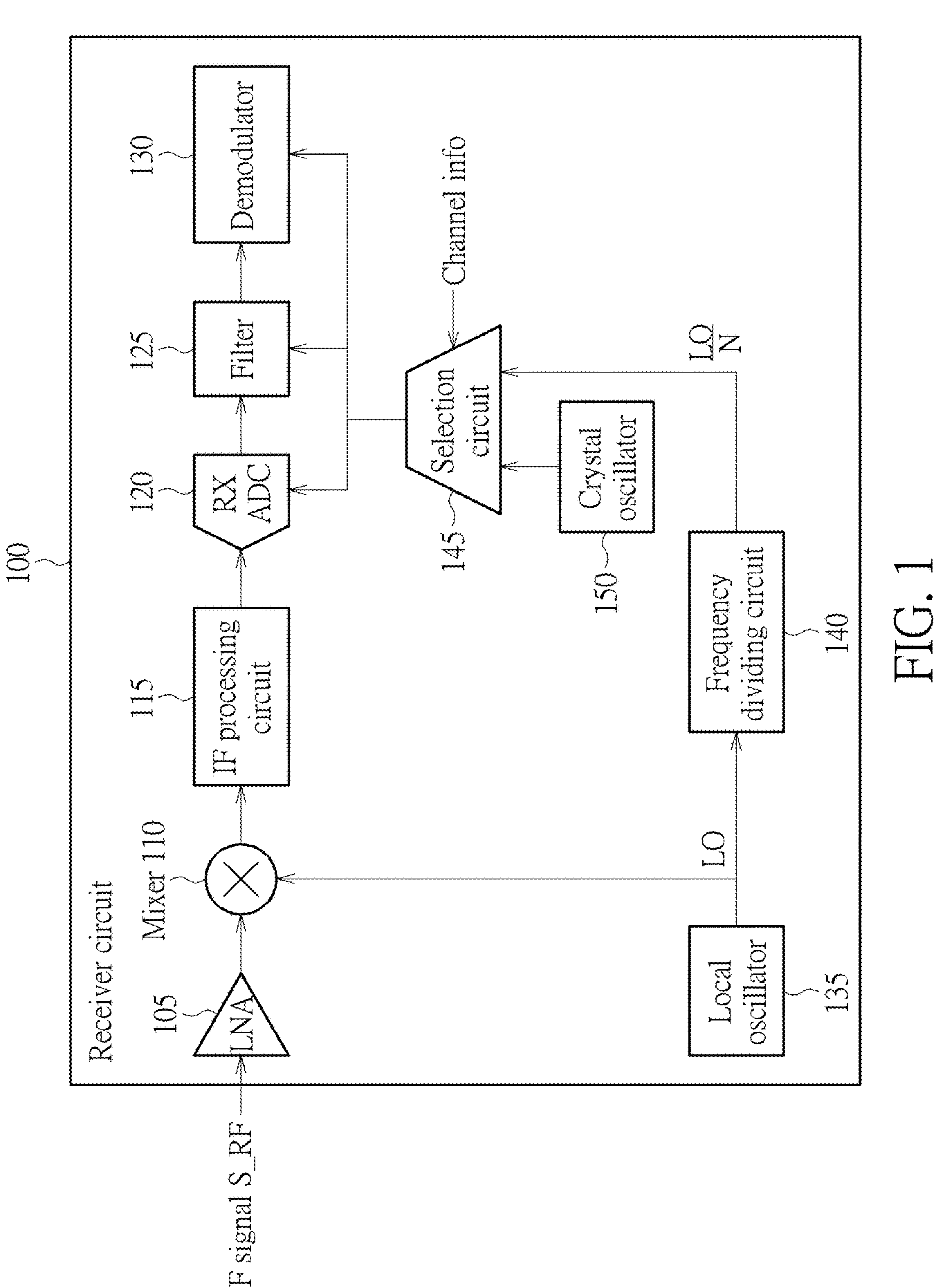
FIG. 1 is a diagram of a receiver circuit according to an embodiment of the invention.

FIG. 1 is a diagram of a receiver circuit 100 according to an embodiment of the invention. The receiver circuit 100 comprises a low noise amplifier (LNA) 105, a mixer 110, an intermediate frequency (IF) processing circuit 115, a receiver analog-to-digital converter (RX ADC) 120, a filter 125, a demodulator 130, a local oscillator 135 (e.g. a synthesizer), a frequency dividing circuit 140, a selection circuit 145, and a specific oscillator such as crystal oscillator 150 for generating a reference/target frequency signal.

For the operation, the LNA 105 is used for amplifying the radio-frequency (RF) signal S_RF and managing noise in the RF system of the receiver circuit 100, e.g. amplifying the weak input signal while contributing minimal additional noise to the receiver circuit 100. The mixer 110 is coupled between the LNA 105 and IF processing circuit 115, and it is used for mixing the amplified RF signal S_RF with a local oscillator signal (e.g. a local oscillation frequency signal) LO to generate an intermediate frequency (IF) signal by performing a signal down conversion to convert the amplified RF signal S_RF into the lower intermediate frequency signal based on the local oscillator signal LO generated from the local oscillator 135. The IF signal is then transmitted from the mixer 110 into the IF processing circuit 115. Then, the IF processing circuit 115 is coupled between the mixer 110 and RX ADC 120, and it is used to perform an IF processing operation (e.g. band-pass filtering operation (but not limited)) upon the IF signal to generate a baseband signal such as a baseband analog signal into the RX ADC 120.

The RX ADC 120 uses a working sample rate as a working frequency to perform an ADC operation to sample information of the baseband analog signal to convert the baseband analog signal into a digital reception signal (i.e. a baseband digital signal). The digital reception signal is then received and processed by the filter 125 (i.e. a digital filter circuit), which operates and works based on the same working sample rate, to generate a processed digital reception signal; the digital filter circuit for example may be a decimation filter for reducing the sampling rate of the digitized signal while preventing aliasing, a channel selection filter for isolating the desired signal channel while rejecting adjacent channel interference, a DC offset removal filter for eliminating any residual DC components that may have been introduced in the analog front-end or during the conversion process, and/or a matched filter for optimizing the signal-to-noise ratio before symbol detection. Then the demodulator 130, which operates and works based on the same working sample rate, is used for extracting the original information signal from the modulated signal wave of the processed digital reception signal, e.g. performing the signal synchronization, the symbol detection to determine the transmitted symbols, performing and the error correction after the symbol detection.

The working sample rate, regarded as a variable rate, can be dynamically switched between a first sample rate and a second sample rate. The first sample rate and second sample rate are adjacent to a target sample rate, and the first sample rate is lower than the second sample rate. That is, the RX ADC 120 is arranged to work and operate at a lower sample rate in a time interval and work at a higher sample rate in a different time interval dynamically. The dynamic switching of working sample rate can make the first sample rate multiplied by a factor (e.g. a harmonic of the first sample rate) be not in a specific channel frequency of the radio frequency signal and the second sample rate multiplied by the factor (e.g. a harmonic of the second sample rate) be not in the specific channel frequency of the radio frequency signal.

Figure 2:
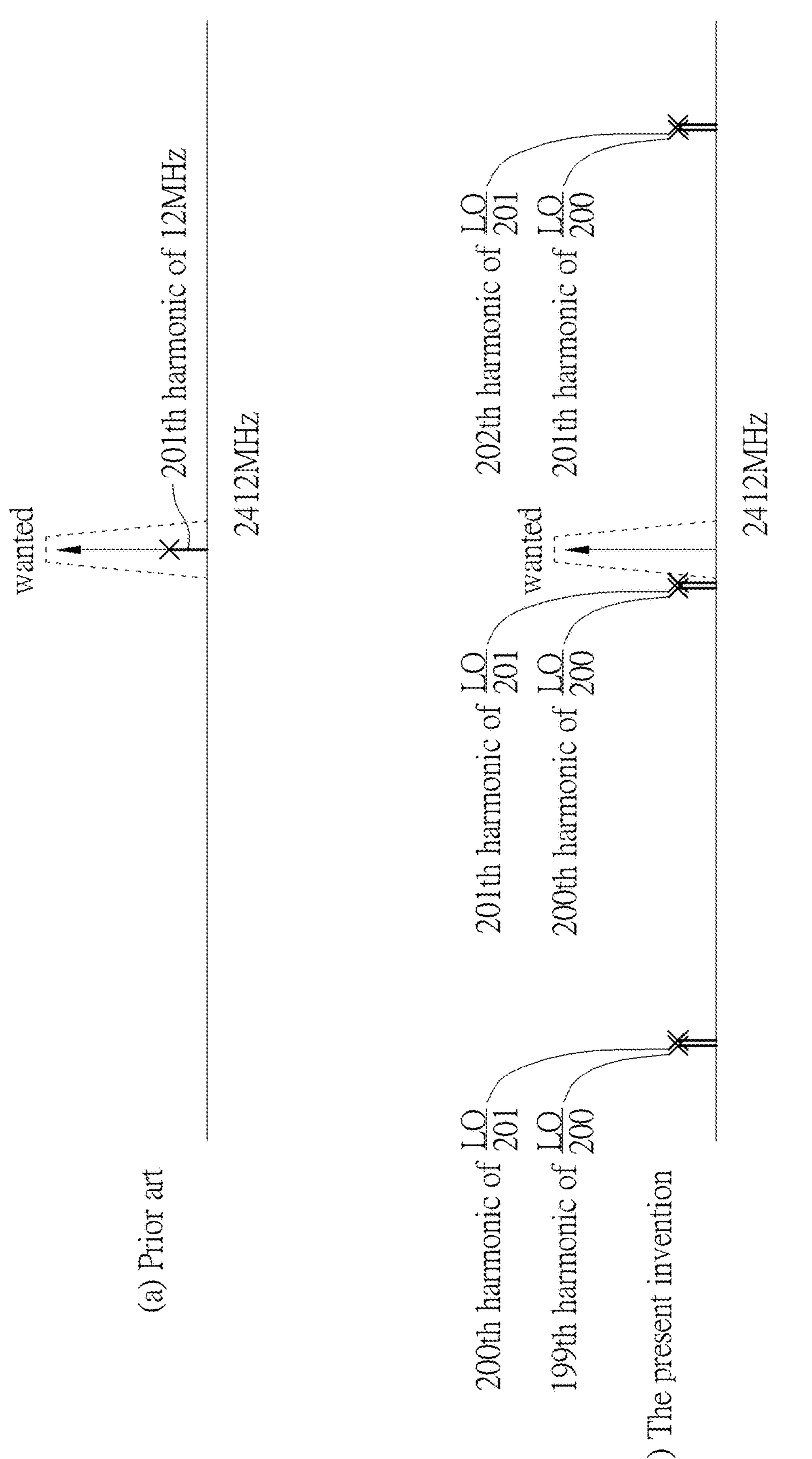
FIG. 2 is a diagram of the comparison between the prior art scheme and the invention method according to an embodiment of the invention.

For example (but not limited), in the prior art scheme, if a fundamental clock frequency (i.e. standard/reference frequency) of a conventional RX ADC in the conventional receiver is 12 MHz (megahertz), then a 201th (or indicated by 201-th) clock harmonic of the fundamental clock frequency will be generated and considered as an internal electromagnetic interference (EMI) affecting the performance of the conventional receiver. FIG. 2 is a diagram of the comparison between the prior art scheme and the invention method according to an embodiment of the invention. As shown in the portion (a) of FIG. 2, in the prior art scheme, the 201th clock harmonic of fundamental clock frequency 12 MHz will exactly occur at a frequency channel of a specific radio frequency 2412 MHz employed by the conventional receiver and becomes the electromagnetic interference for the frequency channel, and thus this will affect the signal-to-noise ratio and corresponding signal reception performance.

The local oscillator 135 is used to generate the local oscillator signal LO into the mixer 110 and into the frequency dividing circuit 140. For implementing the working sample rate, the frequency dividing circuit 140 is used for performing the frequency division operation upon a frequency of the local oscillator signal LO based on a variable and different division ratio N dynamically to generate a variable sample rate LO/N. For example, the frequency dividing circuit 140 performs a first frequency division operation upon the frequency of the local oscillator signal LO based on a first division factor to generate the first sample rate as the variable sample rate LO/N and can perform a second frequency division operation upon the frequency of the local oscillator signal based on a second division factor to generate the second sample rate as the variable sample rate LO/N in a different timing. That is, the variable sample rate LO/N can be switched between the first sample rate (i.e. a lower sample rate) and the second sample rate (i.e. a higher sample rate) dynamically.

The selection circuit 145 is coupled to the specific crystal oscillator 150, RX ADC 120, filter 125, demodulator 130, and the frequency dividing circuit 140, and it is for example a multiplexer which is used for receiving the target sample rate from the specific crystal oscillator 150, for receiving the variable sample rate (i.e. one of the first sample rate and the second sample rate) from the frequency dividing circuit 140, and for selecting and outputting the target sample rate or the variable sample rate (the first sample rate or the second sample rate) to the RX ADC 120, filter 125, and the demodulator 130 according to the control of channel information. For example (but not limited), the selection circuit 145 may output the first sample rate or the second sample rate into the RX ADC 120, filter 125, and the demodulator 130 when the channel information indicates that a channel frequency currently used by the receiver circuit 100 is the specific channel frequency, and it may output the target sample rate into the RX ADC 120, filter 125, and the demodulator 130 when the channel frequency currently used by the receiver circuit 100 is not the specific channel frequency.

For example, as shown in the portion (b) of FIG. 2, for the frequency channel of 2412 MHz, in a condition that the frequency of local oscillator LO is equal to 2411 MHz and the target sample rate generated from the crystal oscillator 150 is equal to 12 MHz, when the variable division ratio N is 200, the second sample rate (i.e. a faster sample rate), e.g.

$$\frac{LO}{N} = \frac{2411\text{ MHz}}{200} = 12.055\text{ MHz}$$

is generated from the frequency dividing circuit 140 and then is selected by the selection circuit 145 as its output to the RX ADC 120, so that all the clock harmonics (e.g. 199th, 200th, and 201th harmonics) of 12.055 MHz will be not in the frequency channel of 2412 MHz and thus the RF signal reception will not be affected by these clock harmonics. Similarly, when the variable division ratio Nis 201, the first sample rate (i.e. a slower sample rate), e.g.

$$\frac{LO}{N} = \frac{2411\text{ MHz}}{201} \cong 11.995\text{ MHz}$$

is generated from the frequency dividing circuit 140 and then is selected by the selection circuit 145 as its output to the RX ADC 120, so that all the clock harmonics (e.g. $199^{th}$, $200^{th}$, and $201^{th}$ harmonics) of 11.995 MHz will be not in the frequency channel of 2412 MHz and thus the RF signal reception will not be affected by these clock harmonics.

In one embodiment, for the target frequency 12 MHz, the receiver circuit 100 may use only the faster adjacent sample rate (e.g. 12.055 MHz) or only the slower adjacent sample rate (e.g. 11.995 MHz) as the working sample rate provided for the RX ADC 120, filter 125, or the demodulator 130. That is, in this situation, the working sample rate will be a fixed and faster adjacent sample rate (or a fixed and slower adjacent sample rate) for the RX ADC 120, filter 125, or the demodulator 130. This can accurately separate the clock harmonics from the used channel frequencies of receiver circuit 100 to mitigate the internal noise interference.

Figure 3:
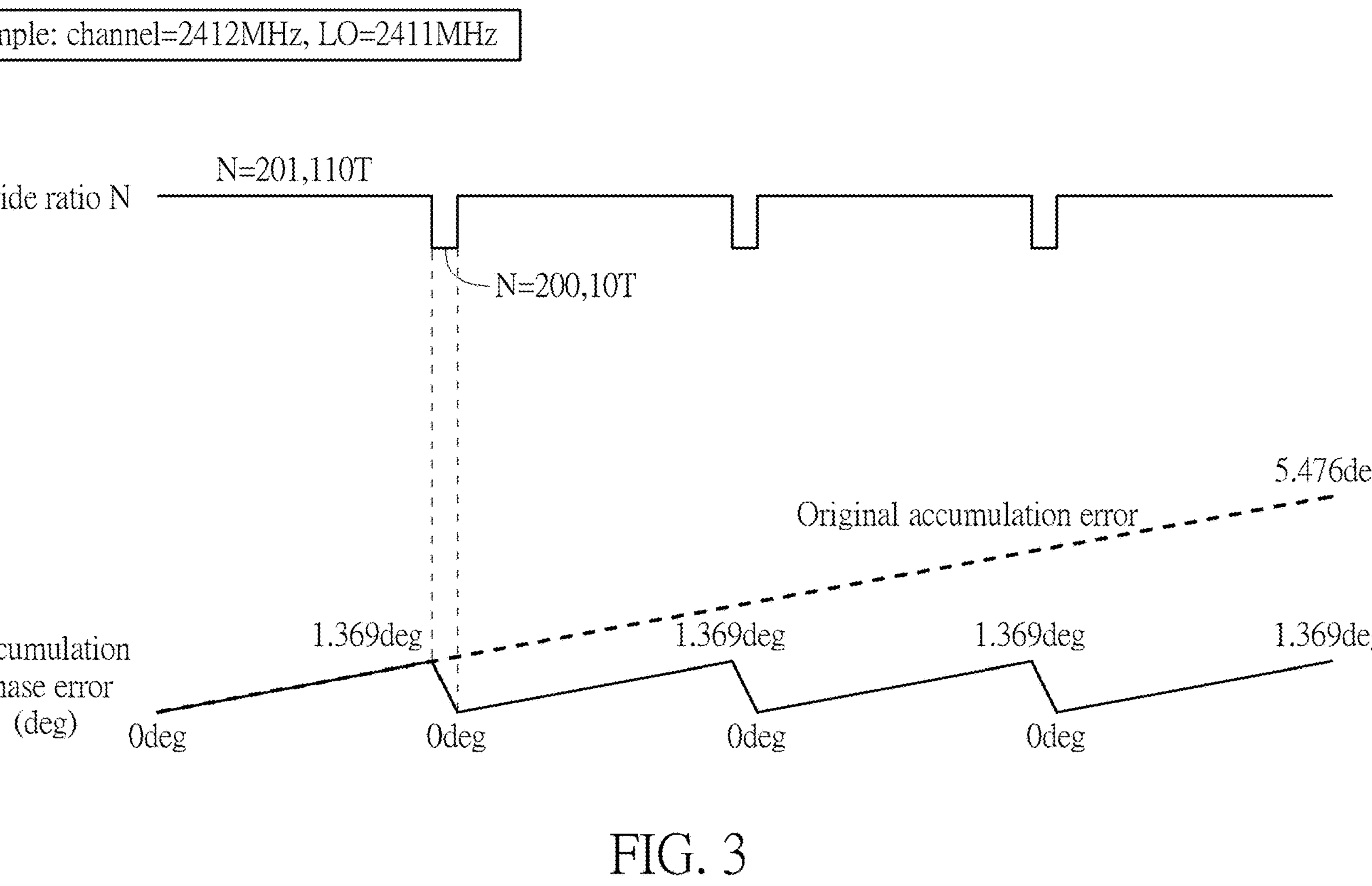
FIG. 3 is a diagram of the operations of the receiver circuit of FIG. 1 for dynamically switching and selecting the different working sample rates according to an embodiment of the invention.

In one embodiment, to further reduce the accumulated phase errors, the working sample rate is variable and switched between the faster adjacent sample rate and slower adjacent sample rate respectively in different time intervals. FIG. 3 is a diagram of the operations of the receiver circuit 100 of FIG. 1 for dynamically switching and selecting the different working sample rates according to an embodiment of the invention. As shown in FIG. 3, for the frequency channel of 2412 MHz, in the condition that the frequency of local oscillator LO is equal to 2411 MHz and the target sample rate generated from the crystal oscillator 150 is equal to 12 MHz, the frequency dividing circuit 140 for example uses the value N=201 (i.e. the first frequency division factor) to perform the first frequency division upon the frequency of local oscillator signal LO to generate and output the frequency signal $$\frac{LO}{N} = \frac{2411\ \text{MHz}}{201} \cong 11.995\ \text{MHz}$$

as the first sample rate into the selection circuit 145 during a first cycle time such as 110 cycles indicated by 110T. The first sample rate 11.995 MHz is different from and slower than the target sample rate 12 MHz, and thus the phase error in the demodulator 130 will be gradually accumulated with a first slope value during the first cycle time. For example, the accumulated phase error at the end of first cycle time may be equal to 1.369 degrees (indicated by 1.369 deg).

To avoid that the originally accumulated phase error become greater than a specific threshold, the frequency dividing circuit 140 is used to alternatively generate the first sample rate into the selection circuit 145 during the first cycle time and generate the second sample rate into the selection circuit 145 during the second cycle time. The frequency dividing circuit 140 after the end of first cycle time for example uses the value N=200 (i.e. the second frequency division factor) to perform the second frequency division upon the frequency of local oscillator signal LO to generate and output the frequency signal $$\frac{LO}{N} = \frac{2411\ \text{MHz}}{200} \cong 12.055\ \text{MHz}$$

as the second sample rate into the selection circuit 145 during a second time interval following the first cycle time, e.g. 10 cycles indicated by 10T. The second sample rate 12.055 MHz is different from and faster than the target sample rate 12 MHz, and thus the phase error accumulated in the demodulator 130 during the first cycle time can be rapidly decreased down to zero degrees (indicated by 0 deg) with a second slope value during the second time interval. By doing so, the operation of dynamically switching the different division factors to generate higher and lower sample rates can control the accumulated phase error within the specified range such as 1.369 degrees (but not limited), to avoid that the accumulated phase error become too much (e.g. 5.476 degrees).

The length of first cycle time is longer than that of the second cycle time, e.g. the length of first cycle time is 11 times of the second cycle time. This alternatively generates the first sample rate into the selection circuit 145 during the first cycle time and generates the second sample rate into the selection circuit 145 during the second cycle time. Specifically, the frequency dividing circuit 140 may calculate a first absolute difference (e.g. 0.005 MHz) between the first sample rate 11.995 MHz and the target sample rate 12 MHz, also calculate a second absolute difference (e.g. 0.055 MHz) between the second sample rate 12.055 MHz and the target sample rate 12 MHz, and then calculate a relation between the first absolute difference 0.005 MHz and the second absolute difference 0.055 MHz, e.g. the relation indicates a value $\frac{1}{11}$. Then, the first cycle time and the second cycle time are determined by the frequency dividing circuit 140 based on a reciprocal value (i.e. 11) of the relation. For example, as shown in FIG. 3, the length of first cycle time is configured as to be 11 times longer than the second cycle time; for example, the first cycle time has 110 cycles, and the second cycle time has 10 cycles.

FIG. 4 is a diagram of an example of the table of corresponding LO frequencies, variable division factors, and generated phase errors in different channel frequencies used by the receiver circuit 100 according to an embodiment of the invention. For example, the receiver circuit 100 is applied into a Bluetooth communication device which may use the frequency channel rage from 2400 MHz to 2483 MHz (but not limited) and start with 2400 MHz, 2401 MHz, and so forth. Any of these frequency channels may be utilized, and only one frequency channel is active at any given time. When the Bluetooth communication device exhibits the frequency hopping behavior, the receiver circuit 100 is arranged to switch from a frequency channel to the corresponding different frequency channel. The table of FIG. 4 for example lists the examples of the receiver circuit 100 using the variable frequency division factor which is dynamically switched between two adjacent division factors when the different clock harmonics of the target sample rate 12 MHz exactly occur in the frequency channels.

For example, for the frequency channel of 2412 MHz in the first row of the table, the frequency of local oscillator signal LO is selected as 2411 MHz by the local oscillator 135, and the ratio of the frequency of local oscillator signal LO divided by 12 MHz is calculated as $$\frac{2411}{12} \cong 200.917$$

(indicated by ratio to fref) by the frequency dividing circuit 140. Then, to avoid the clock harmonic interference, the frequency dividing circuit 140 can use a neighboring integer value such as a first division factor 201 (indicated by div1)

to perform the frequency division operation upon the frequency 2411 MHz of local oscillator signal LO to generate the frequency signal $$\frac{2411\text{ MHz}}{201} \cong 11.995\text{ MHz}$$

(indicated/> by fade1) as the first sample rate, and the phase error of first sample rate deviating from 12 MHz over time accumulated and measured in ppm (parts per million) is for example −415 (indicated by error1) when the selection circuit 145 selects and outputs the first sample rate rather than the target sample rate 12 MHz for the demodulator 130. Similarly, to avoid the clock harmonic interference, the frequency dividing circuit 140 can use a different neighboring integer value such as a second division factor 200 (indicated by div2) to perform the frequency division operation upon the frequency 2411 MHz of local oscillator signal LO to generate the frequency signal $$\frac{2411\text{ MHz}}{200} \cong 12.055\text{ MHz}$$

(indicated by fade2) as the second sample rate, and the phase error of second sample rate deviating from 12 MHz over time accumulated and measured in ppm is for example 4583 (indicated by error2) when the selection circuit 145 selects and outputs the second sample rate rather than the target sample rate 12 MHz for the demodulator 130. The ratio of the first division factor div1 divided by the second division factor div2 is 11, and correspondingly the first cycle time is set as 110 cycles while the second cycle time is set as 10 cycles to perform dynamic frequency switching so as to avoid that the accumulated phase error become too much. For example, the accumulated phase error at the end of first cycle time (i.e. 110 cycles) is equal to 1.369 degrees, and the SNR (signal to noise ratio) loss at the end of first cycle time may be 0.058 dB (decibels); they are still in the corresponding tolerable ranges.

For example, for the frequency channel of 2424 MHz in the second row of the table, the frequency of local oscillator signal LO is selected as 2423 MHz by the local oscillator 135, and the ratio of the frequency of local oscillator signal LO divided by 12 MHz is calculated as $$\frac{2423}{12} \cong 201.917$$

(indicated by ratio to fref) by the frequency dividing circuit 140. Then, to avoid the clock harmonic interference, the frequency dividing circuit 140 can use a neighboring integer value such as a first division factor 202 (indicated by div1) to perform the frequency division operation upon the frequency 2423 MHz of local oscillator signal LO to generate the frequency signal $$\frac{2423\text{ MHz}}{202} \cong 11.995\text{ MHz}$$

(indicated by fade1) as the first sample rate, and the phase error of first sample rate deviating from 12 MHz over time accumulated and measured in ppm (parts per million) is for example −413 (indicated by error1) when the selection circuit 145 selects and outputs the first sample rate rather than the target sample rate 12 MHz for the demodulator 130. Similarly, to avoid the clock harmonic interference, the frequency dividing circuit 140 can use a different neighboring integer value such as a second division factor 201 (indicated by div2) to perform the frequency division operation upon the frequency 2423 MHz of local oscillator signal LO to generate the frequency signal $$\frac{2423\text{ MHz}}{201} \cong 12.055\text{ MHz}$$

(indicated by fade2) as the second sample rate, and the phase error of second sample rate deviating from 12 MHz over time accumulated and measured in ppm is for example 4561 (indicated by error2) when the selection circuit 145 selects and outputs the second sample rate rather than the target sample rate 12 MHz for the demodulator 130. The ratio of the first division factor div1 divided by the second division factor div2 is 11, and correspondingly the first cycle time is set as 110 cycles while the second cycle time is set as 10 cycles to perform dynamical switching so as to avoid that the accumulated phase error become too much. For example, the accumulated phase error at the end of first cycle time (i.e. 110 cycles) is equal to 1.362 degrees, and the SNR (signal to noise ratio) loss at the end of first cycle time may be 0.058 dB (decibels); they are still in the corresponding tolerable ranges.

Similarly, for the other different frequency channels of 2436 MHz, 2448 MHz, 2460 MHz, and 2472 MHz in the other rows of the table, the correspondingly setting of the frequency of local oscillator signal LO, first division factor, second division factor, corresponding phase errors, the ratio of two division factors, and SNR loss are similar and can be seen in FIG. 4. The corresponding description is not detailed again for brevity. It should be noted that the selection circuit 145 is arranged to select and output the variable sample rate (either the first sample rate or second sample rate) for the RX ADC 120, filter 125, and demodulator 130 to avoid clock harmonic interference when the receiver circuit 100 receives the RF signal which may be affected by the harmonics of the target sample rate 12 MHz, e.g. the frequency channels of RF signals are multiples (e.g. 2412 MHz, 2424 MHz, 2436 MHz, 2448 MHz, 2460 MHz, and 2472 MHz) of the target sample rate 12 MHz. For the other frequency channels different from the multiples of the target sample rate 12 MHz, the selection circuit 145 is arranged to directly select and output the target sample rate 12 MHz for the RX ADC 120, filter 125, and demodulator 130, and in this situation no clock harmonic interferences and no phase errors occur and thus it is not needed to employ the dynamic frequency switching.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver circuit comprising:

a mixer for mixing a radio frequency signal with a local oscillator signal to generate an intermediate frequency signal;

an intermediate frequency processing circuit, coupled to the mixer, for generating a baseband signal according to the intermediate frequency signal; and a receiver analog-to-digital converter (ADC), coupled to the intermediate frequency processing circuit, for sampling information of the baseband signal to convert the baseband signal into a digital reception signal according to a working sample rate;

wherein the working sample rate is dynamically switched between a first sample rate and a second sample rate which are adjacent to a target sample rate, to make a harmonic of the first sample rate be not in a specific channel frequency of the radio frequency signal and a harmonic of the second sample rate be not in the specific channel frequency of the radio frequency signal; and the first sample rate is lower than the target sample rate while the second sample rate is higher than the target sample rate.

2. The receiver circuit of claim 1, further comprising:

a specific oscillator for generating the target sample rate;

a frequency dividing circuit, for performing a first frequency division operation upon a frequency of the local oscillator signal based on a first division factor to generate the first sample rate, and for performing a second frequency division operation upon the frequency of the local oscillator signal based on a second division factor to generate the second sample rate; and a selection circuit, coupled to the specific oscillator, the receiver ADC, and the frequency dividing circuit, for receiving the target sample rate from the specific oscillator and receiving one of the first sample rate and the second sample rate from the frequency dividing circuit, for outputting the first sample rate or the second sample rate into the receiver ADC when a channel frequency currently used by the receiver circuit is the specific channel frequency, and for outputting the target sample rate into the receiver ADC when the channel frequency currently used by the receiver circuit is not the specific channel frequency.

3. The receiver circuit of claim 2, wherein the first division factor and the second division factor are adjacent integers.

4. The receiver circuit of claim 2, wherein the frequency dividing circuit is used to generate the first sample rate into the selection circuit during a first cycle time and generate the second sample rate into the selection circuit during a second cycle time following the first cycle time.

5. The receiver circuit of claim 4, wherein the first cycle time and the second cycle time are determined based on a relation between a first absolute difference and a second absolute difference, and the first absolute difference is generated from a difference between the first sample rate and the target sample rate while the second absolute difference is generated from a difference between the second sample rate and the target sample rate.

6. The receiver circuit of claim 5, wherein the first cycle time is N times longer than the second cycle time when the second absolute difference is N times the first absolute difference, and N is a positive integer.

7. The receiver circuit of claim 4, wherein the frequency dividing circuit is used to alternatively generate the first sample rate into the selection circuit during the first cycle time and generate the second sample rate into the selection circuit during the second cycle time.

8. A method of a receiver circuit comprising:

providing a mixer to mix a radio frequency signal with a local oscillator signal to generate an intermediate frequency signal;

providing an intermediate frequency processing circuit to generate a baseband signal according to the intermediate frequency signal;

using a receiver analog-to-digital converter (ADC) to sample information of the baseband signal to convert the baseband signal into a digital reception signal according to a working sample rate; and dynamically switching the working sample rate between a first sample rate and a second sample rate which are adjacent to a target sample rate, to make a harmonic of the first sample rate be not in a specific channel frequency of the radio frequency signal and a harmonic of the second sample rate be not in the specific channel frequency of the radio frequency signal;

wherein the first sample rate is lower than the target sample rate while the second sample rate is higher than the target sample rate.

9. The method of claim 8, further comprising:

using a specific oscillator to generate the target sample rate;

performing a first frequency division operation upon a frequency of the local oscillator signal based on a first division factor to generate the first sample rate;

performing a second frequency division operation upon the frequency of the local oscillator signal based on a second division factor to generate the second sample rate;

using a selection circuit to receive the target sample rate from the specific oscillator and to receive one of the first sample rate and the second sample rate, to output the first sample rate or the second sample rate into the receiver ADC when a channel frequency currently used by the receiver circuit is the specific channel frequency and to output the target sample rate into the receiver ADC when the channel frequency currently used by the receiver circuit is not the specific channel frequency.

10. The method of claim 9, wherein the first division factor and the second division factor are adjacent integers.

11. The method of claim 9, further comprising:

generating the first sample rate into the selection circuit during a first cycle time and generating the second sample rate into the selection circuit during a second cycle time following the first cycle time.

12. The method of claim 11, further comprising:

determining the first cycle time and the second cycle time based on a relation between a first absolute difference and a second absolute difference;

wherein the first absolute difference is generated from a difference between the first sample rate and the target sample rate while the second absolute difference is generated from a difference between the second sample rate and the target sample rate.

13. The method of claim 12, wherein the first cycle time is N times longer than the second cycle time when the second absolute difference is N times the first absolute difference, and N is a positive integer.

14. The method of claim 11, further comprising:

alternatively generating the first sample rate into the selection circuit during the first cycle time and generating the second sample rate into the selection circuit during the second cycle time.

* * * * *